(12) United States Patent
Platz

(10) Patent No.: US 6,521,830 B1
(45) Date of Patent: Feb. 18, 2003

(54) HOUSING FOR ELECTRICAL OR ELECTRONIC DEVICES WITH INTEGRATED CONDUCTOR TRACKS

(75) Inventor: Reinhold G. Platz, Mühltal (DE)

(73) Assignee: Ticona GmbH (DE)

( * ) Notice: Subject to any disclaimer, the term of this patent is extended or adjusted under 35 U.S.C. 154(b) by 0 days.

(21) Appl. No.: 09/660,971

(22) Filed: Sep. 13, 2000

(30) Foreign Application Priority Data

Sep. 16, 1999 (DE) .......................... 199 44 383

(51) Int. Cl.⁷ ...................... H05K 5/00; H01Q 1/42
(52) U.S. Cl. .................. 174/50; 361/679; 343/872
(58) Field of Search ................. 361/679, 730; 343/872, 850; 174/50; H05K 5/00; H01Q 1/42

(56) References Cited

U.S. PATENT DOCUMENTS

| | | | |
|---|---|---|---|
| 3,590,136 A | 6/1971 | Yamanaka et al. ............ 174/50 |
| 5,090,122 A | 2/1992 | Kitagawa ..................... 29/852 |
| 5,122,861 A * | 6/1992 | Tamura et al. ................ 357/74 |
| 5,179,601 A | 1/1993 | Gotoh et al. .................. 385/14 |
| 5,243,130 A | 9/1993 | Kitagawa ..................... 174/50 |
| 5,264,393 A * | 11/1993 | Tamura et al. .............. 437/209 |

FOREIGN PATENT DOCUMENTS

DE 295 01 849 4/1995

* cited by examiner

Primary Examiner—Hoanganh Le
(74) Attorney, Agent, or Firm—Connolly Bove Lodge & Hutz LLP

(57) ABSTRACT

A housing for electrical or electronic devices or components comprises a molding (1) of thermoplastic material which has at selected locations on its surface electrical conductor tracks (5) with contact pins (3, 6) attached at predetermined locations, the conductor tracks (5) being covered with a layer (8) of thermoplastic material. A multi-layer molding is preferably concerned here, with conductor tracks being located between at least two layers and possibly also having applied to them electronic components, such as sensors, microswitches or surface-mounted devices, which are optionally encapsulated at the same time.

12 Claims, 2 Drawing Sheets

HOUSING FOR ELECTRICAL OR ELECTRONIC DEVICES WITH INTEGRATED CONDUCTOR TRACKS

BACKGROUND OF THE INVENTION

Figure 1:
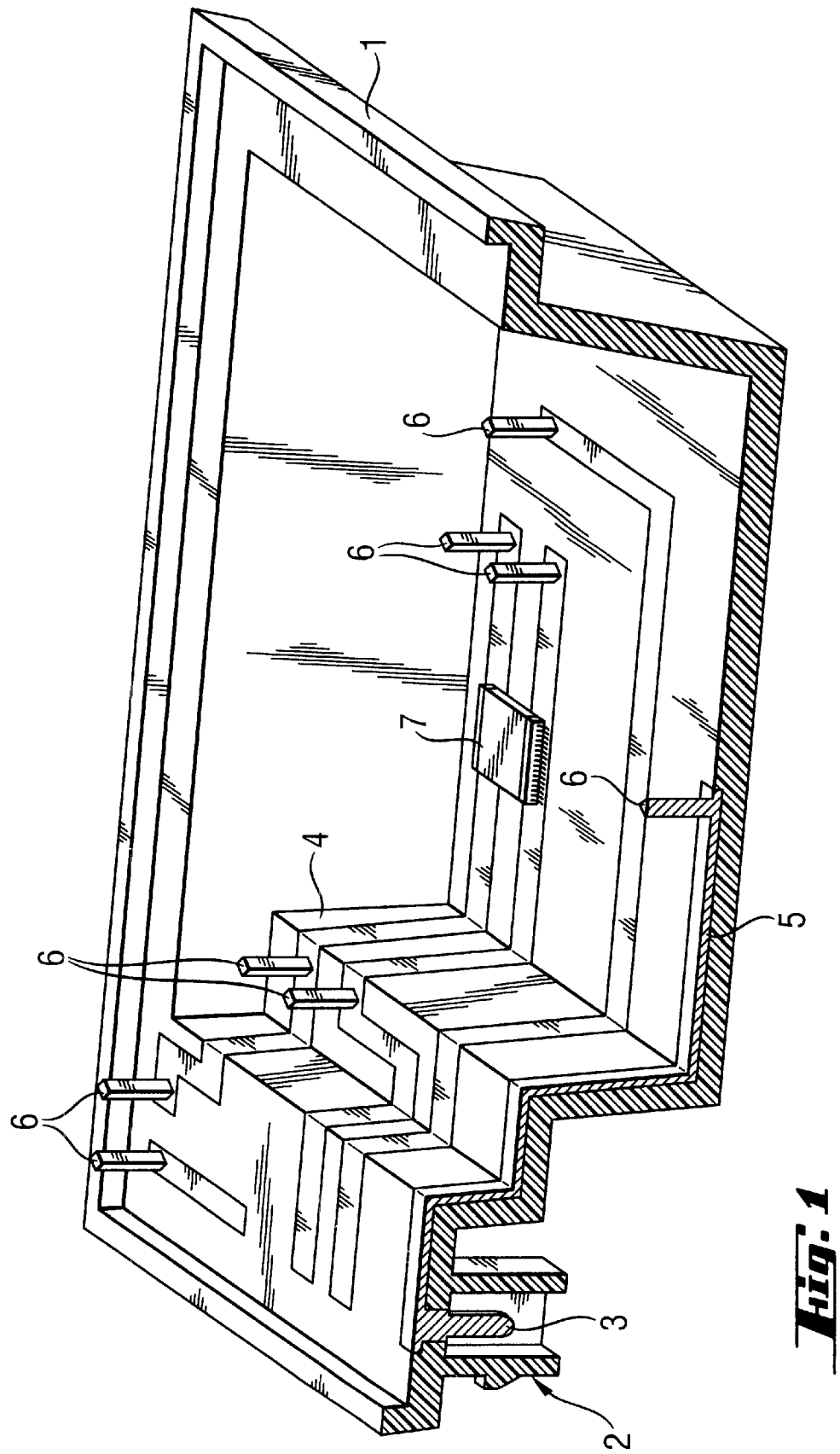

The present invention relates to a housing for electrical or electronic devices of a thermoplastic material which contains integrated conductor tracks, electronic components and electrical contacts, and to a process for its production. The conductor tracks and electronic components are in this case sealed by a thermoplastic material. The present application is related to the german application DE 19944383.1, which is incorporated by reference for all useful purposes.

Widely known are boards for electric circuits which bear on their surface electrical conductor tracks to which electronic components such as transistors, relays, computer chips etc. are soldered. The boards are generally produced from an electrically insulating thermosetting material.

Also known are plug-in connectors of plastic, which have on one side contact pins or contact tubes which are molded or fitted into the plastic. Fastened on the other (rear) side of the contact pins or contact tubes are electrical lines, which are generally brought together to form a cable. These plug-in connectors do not, however, contain electrical conductor tracks which interconnect various of the contact pins or contact tubes.

Components for electrical or electronic devices are usually constructed in such a way that, for example, an electric motor, an electrical circuit etc. is surrounded by a housing. The electrical contacting in this case usually takes place through a cable, which is led through an opening in the housing and is connected to the electrical or electronic devices directly or with the aid of a plug-in connector.

In mechanical and automotive engineering, in particular, there are many examples of such subassemblies: distribution boxes, boxes for fuses and boxes for special vehicle electronics, in each case comprising a housing, a board with electric circuits and components and a separate power supply lead, which is led through an opening in the housing, and housings for door locks, window lifting drive mechanisms or windshield wiper drive mechanisms, which contain, inter alia, an electric motor and a power supply lead led through the housing.

A problem which arises here is often inadequate protection of the electrical or electronic components against moisture, since the cable bushings of the power supply leads usually do not fit exactly, or if so not permanently, and no separate sealing is carried out. On the other hand, the threading in of the power supply lead and the connection of the end of the cable of the power supply lead to the electrical or electronic devices that are located, and possibly fastened, inside the housing mean that many working steps are necessary for assembly.

In the not yet published German patent application No 199 378 65.7 there is a description of plastic moldings which have on one side of their surface electrical conductor tracks into which contact pins are fitted, part of these contact pins protruding from the surface with the electrical conductor tracks and part of the contact pins penetrating through the layer of plastic and protruding out on the other, opposite side. These plastic moldings are intended, in particular, as housings for electrical or electronic devices and components. In them, however, the electrical conductor tracks are often exposed on the surface and can consequently be shorted by moisture or electrolytes.

SUMMARY OF THE INVENTION

The object was therefore to find an improved possible way of producing electrical or electronic subassemblies which as far as possible also permits simple assembly.

This object is achieved according to the invention by a plastic molding which contains electrical conductor tracks, contact pins and optionally plug-in connections or surface-mounted devices being provided, the conductor tracks being covered by a layer of insulating plastic.

DETAILED DESCRIPTION OF THE INVENTION

The invention therefore relates to a housing for electrical or electronic devices, comprising a molding of a thermoplastic material which contains at selected locations on its surface electrical conductor tracks into which contact pins or boreholes for introducing contact pins are provided at predetermined locations, the conductor tracks being covered with a layer of a thermoplastic material. In a preferred embodiment, the housing according to the invention comprises a multi-layer molding of thermoplastic material, the molding having at least two layers of thermoplastic material between which there are electrical conductor tracks and possibly electronic components, into which contact pins or boreholes for introducing contact pins have been fitted at predetermined locations.

The invention also relates to processes for producing the housing according to the invention as described below and in the claims.

The molding according to the invention combines the functions of a housing and a board. Its advantages are, for example, that the housing does not need an opening for leading the power supply lead through and consequently complete exclusion of moisture can be ensured inside the housing, where the conductor tracks and the electrical or electronic device are located. Power supply leads can, moreover, be easily fitted onto the outside of the housing, on plug-in connections formed by contact pins protruding out.

The design of the conductor tracks and, in addition, fitting of electronic parts or subassemblies (for example sensors, microswitches, surface-mounted devices) onto the contact pins or their insertion into prefabricated boreholes allow an electronic circuit to be created inside the housing. If, apart from the electronic circuit, the housing encloses electrical components, for example an electric motor, the contact to the electrical component can also take place through a separate plug-in connection, i.e. by a cable and a plug which is fitted on inside the housing, but it is more advantageous for the electrical component itself to be fitted directly onto the contact pins. With the last variant, in particular, several working steps can be saved. In addition, electronic components can be adhesively bonded or soldered directly onto the conductor tracks, which are then likewise completely covered by the second layer of plastic.

The housing molding according to the invention consists of at least one thermoplastic material or plastics blend and may optionally also be reinforced. With respect to the thermoplastic material for covering the conductor tracks and in the case of the multi-layer construction of the molding, it is quite possible for different plastics or plastics blends to be used. In this case, it must be ensured that plastics which come into contact with the conductor tracks and the contact pins are electrically insulating and that neighboring layers consist of plastics materials which are compatible with one another, fuse with one another or enter into a close adhesive bond.

For applications in mechanical and automotive engineering, plastics which are particularly preferred are polyacetals, in particular polyoxymethylene homopolymers and copolymers (POM), polyesters, in particular polyethylene terephthalate (PET) and polybutylene terephthalate (PBT), polyarylene ethers and sulfides, in particular polyphenylene oxide (PPO) and sulfide (PPS), polyolefins, in particular high- and low-molecular weight polyethylene (PE) and polypropylene (PP), polyamides (PA), polycarbonates (PC), cycloolefinic homopolymers and copolymers (COC) and liquid-crystal polymers (LCP). Preferred plastics blends are high impact mixtures, for example with thermoplastic elastomers or acrylonitrilestyrene blends, but also mixtures of the aforementioned plastics with one another or with other components.

The thermoplastic material or blend may contain customary additives and additions such as stabilizers, antioxidants, flame retardants etc. as well as colorants, fillers and reinforcing agents. To ensure particular strength of the molding, it may also be advantageous to use as a reinforcing agent, in addition to or in place of other fine particles with an average particle length <0.5 mm, for example chopped glass strands, particles with an average particle length >0.5 mm, in particular >1 mm or even >5 mm, for example continuous glass strand-reinforced polyacetal, polyamide, polyolefin or polyester. In particular if carbon black is added for black coloration of the molding, it must be ensured that the plastic does not become conductive and cause leakage currents or short-circuits.

Metallic conductor tracks may be applied to the surface of the plastic by generally known methods such as hot embossing or electroplating techniques, may be introduced into or applied to the surface of the plastic using modern laser techniques or may be placed on in the form of leadframes. For the purpose of saving working steps in the production of the housing molding according to the invention, the use of prefabricated metal foils is particularly advantageous here.

The conductor tracks may, however, also consist of a conductive plastic and be applied for example by the injection-molding method or be placed in as a prefabricated unit and possibly welded to the surface of the molding by means of a laser. Conductive plastics may contain conductive carbon black, conductive graphite and metallic particles, in particular chips, powders or fibers, individually or in combination. Contact points may optionally also be produced from the same material.

Just like the housing molding, the conductor tracks may assume a predetermined three-dimensional shape. In this case, elevations and depressions as well as thicker and thinner locations may optionally also be provided.

Contact pins can be introduced into the conductor tracks at predetermined locations. This can take place by firing or fitting in metallic pins. Contact points can also be produced, however, by other methods, for example by spraying or soldering on electrically conductive materials. Optionally, however, openings in the conductor tracks and the layer of plastic covering them, into which contact pins or components can be fitted, may also be provided by means of boreholes, pins in the mold etc.

Contact pins may optionally be inserted in the plastic and protrude with one end from the conductor track or pass through the layer of plastic and project with one end out of the plastic on the opposite side, the other end of the contact pin terminating with the surface of the conductor track or additionally also protruding from the latter.

The housing molding according to the invention is produced, for example, by using the injection-molding or thermoforming process to mold a blank to which prefabricated conductor tracks are applied, possibly together with contact pins or electronic components, and subsequently encapsulated and sealed by a second layer of thermoplastic material. In this way, plugs and holding elements can also be produced at the same time.

The contact pins are generally of a simple cylindrical or rectangular form. To improve the contact with the conductor track, however, it is advantageous if the contact pins have a greater cross section at the location with which they are in contact with the conductor track after firing in. Pins of this type are widely known. To improve the contacting, the connection between the contact pin and the conductor track may be covered with a conductive adhesive or, in particular in the case of glass fiber-reinforced plastics, covered with a solder. In the case of contact pins which pass through the plastic, the adhesive bonding or soldering also prevents moisture from diffusing through the hole in which the contact pin is fitted and getting into the interior of the housing.

The thickness of the conductor tracks is to be selected according to the specific requirements of an application. Thicknesses of 35 to 100 microns are customary. In particular when using prefabricated conductor track systems, the conductor tracks may already be fitted with electronic components, such as sensors, microswitches, surface-mounted devices etc., and may be soldered or adhesively bonded to them. These components are then likewise encapsulated with thermoplastic material when the conductor tracks are covered.

The molding according to the invention is used, for example, as a door lock housing, as a housing for window lifting or windshield wiper drive mechanisms, in the form of a door module with integrated electrical lines and contacts, for tank sensors or for distribution boxes. Depending on the use, it may be necessary here for the molding to be additionally provided with a seal or fastening elements. This advantageously likewise takes place in one operation with the production of the molding, for example in a multi-component injection-molding process, but may also take place in a separate working step. All references described above are incorporated by reference for all useful purposes.

The following exemplary embodiments are intended to illustrate the invention for a person skilled in the art, without however being of a restrictive character.

FIG. 1 shows perspectively and in cross section (front view) the three-dimensionally shaped blank 1 of a plastic housing which has toward one side an integrated plug-in connection 2 with contact pins 3. On the other side 4 there are conductor tracks 5, with contact pins 6 and an electronic subassembly 7.

Figure 2:
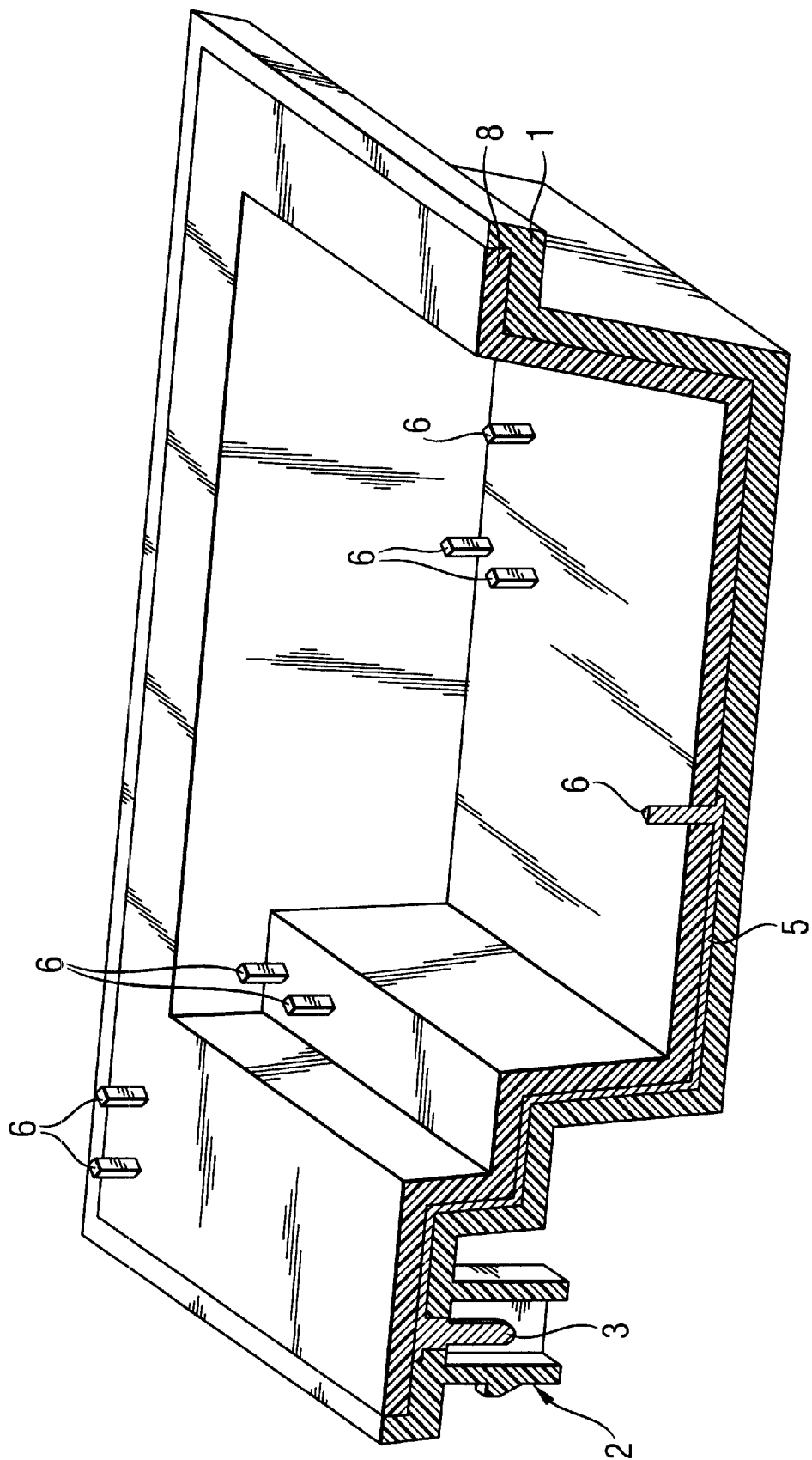

FIG. 2 shows in the same view the blank from FIG. 1, coated with an additional layer 8 of thermoplastic material, as a finished plastics housing.

I claim:

1. A housing for electrical or electronic devices or components, said housing comprising a multi-layer injection molding of thermoplastic material the molding having at least two layers of thermoplastic material, electrical conductor tracks between the layers of thermoplastic material, and contact pins fitted at predetermined locations in the housing engaging the conductor tracks and wherein the thermoplastic material is selected from the group consisting of polyacetal, polyoxymethylene homopolymer or copolymer, polyester, polyethylene terephthalate, polybutylene terephthalate, polyarylene ether or sulfide, polyphenylene oxide or sulfide, polyolefin, high- or low-molecular weight polyethylene or polypropylene, polyamide, polycarbonate, cycloolefinic hompolymer or copolymer, liquid-crystal polymer, and mixtures thereof.

2. The housing as claimed in claim 1, wherein the thermoplastic material contains an impact modified polymer mixture.

3. The housing as claimed in claim 1, wherein the thermoplastic material used for the molding is the same as the thermoplastic material with which the conductor tracks are covered.

4. The housing as claimed in claim 1, wherein the thermoplastic material used for the molding is different than the thermoplastic material with which the conductor tracks are covered.

5. The housing as claimed in claim 1, including an integrated plug and connection on the outside of the housing.

6. A process for producing a housing for electrical or electronic devices or components, comprising a molding with at least two layers of thermoplastic material, between which there are conductor tracks into which contact pins are fitted at predetermined locations, a molding blank being molded of one of the at least two layers of thermoplastic material, the conductor tracks being applied to the blank, the contact pins, being connected to the conductor tracks, and the conductor tracks being sealed by molding another one of the at least two layers of a thermoplastic material over the tracks.

7. The process as claimed in claim 6, wherein, during the sealing of the conductor tracks, the electronic components are likewise covered with thermoplastic material.

8. The process as claimed in claim 6, wherein the process comprises at least two injection-molding steps.

9. The process as claimed in claim 6, wherein the contact pins being fired into prefabricated holes.

10. The process as claimed in claim 6, the electronic components used comprising at least one surface-mounted device, at least one microswitch or at least one sensor.

11. The process as claimed in claim 6, the molding blank being produced by thermoforming.

12. The process as claimed in claim 6, the conductor tracks being applied to the molding blank by hot embossing, by an electroplating method, using laser radiation or by injection-molding of a conductive plastics molding composition.

* * * * *